(12) United States Patent
Hirasawa

(10) Patent No.: US 6,688,840 B2
(45) Date of Patent: Feb. 10, 2004

(54) TRANSPORT APPARATUS AND METHOD

(75) Inventor: Shuichi Hirasawa, Ibaraki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/133,330

(22) Filed: Apr. 29, 2002

(65) Prior Publication Data

US 2002/0162728 A1 Nov. 7, 2002

(30) Foreign Application Priority Data

May 2, 2001 (JP) ........................................ 2001-135445

(51) Int. Cl.$^7$ ........................ B65G 49/07; B65G 47/10; B65G 47/46; B65G 29/00; B65G 37/00
(52) U.S. Cl. ................. 414/937; 414/940; 198/370.01; 198/465.1
(58) Field of Search ................................ 414/937, 940, 414/939; 198/346.1, 370.01, 465.1, 465.4

(56) References Cited

U.S. PATENT DOCUMENTS

| | | | | |
|---|---|---|---|---|
| 5,586,585 A | * | 12/1996 | Bonora et al. .............. | 414/939 |
| 5,700,127 A | * | 12/1997 | Harada et al. .............. | 414/939 |
| 5,707,537 A | * | 1/1998 | Bartha et al. ................ | 216/2 |
| 5,788,448 A | * | 8/1998 | Wakamori et al. .......... | 414/940 |
| 5,863,170 A | * | 1/1999 | Boitnott et al. ............. | 414/937 |
| 5,964,561 A | * | 10/1999 | Marohl ....................... | 414/940 |
| 6,280,134 B1 | * | 8/2001 | Nering ........................ | 414/940 |

FOREIGN PATENT DOCUMENTS

JP           6-140493          5/1994

* cited by examiner

*Primary Examiner*—Gene O. Crawford
(74) *Attorney, Agent, or Firm*—Fitzpatrick, Cella, Harper & Scinto

(57) ABSTRACT

A transport apparatus for transporting a carrier with a plurality of works placed thereon includes a loader for loading the carrier into a processing unit for performing a predetermined process for the works and a transporter for receiving the carrier loaded by the loader and intermittently transporting the carrier such that the plurality of works are sequentially positioned at a process position of the processing unit one by one. In addition, an unloading mechanism receives the carrier from the transporter after all of the plurality of works are subjected to the predetermined process at the process position, and unloads the carrier outside the processing unit, wherein the work is processed in the state it is placed on the carrier.

10 Claims, 20 Drawing Sheets

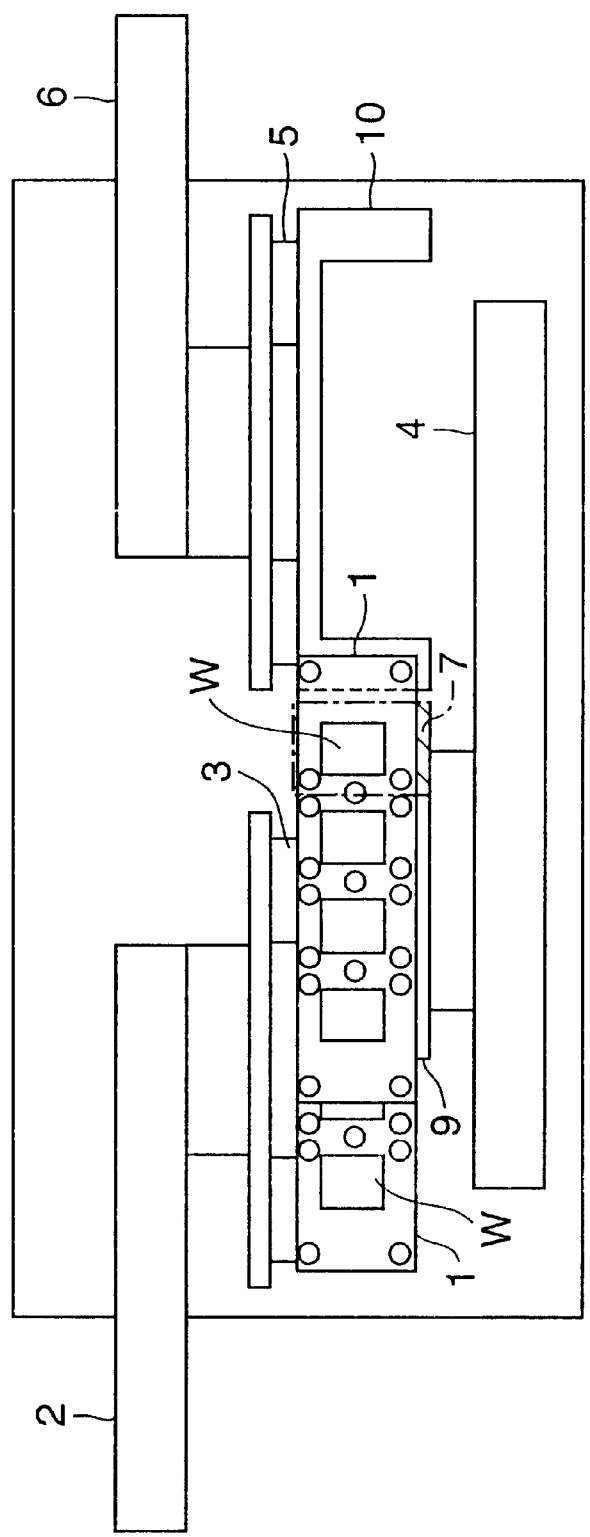

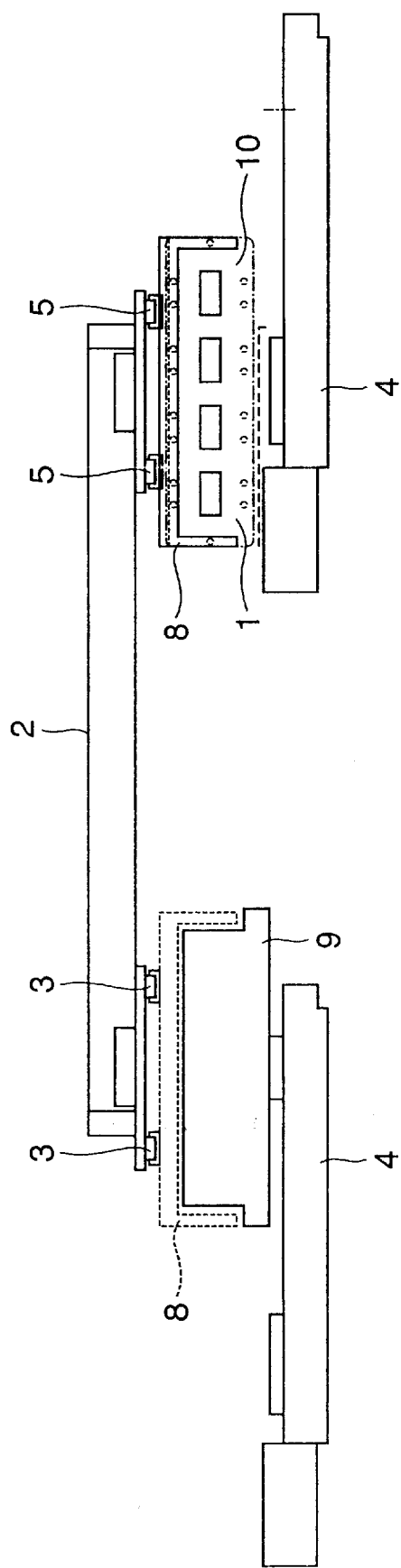

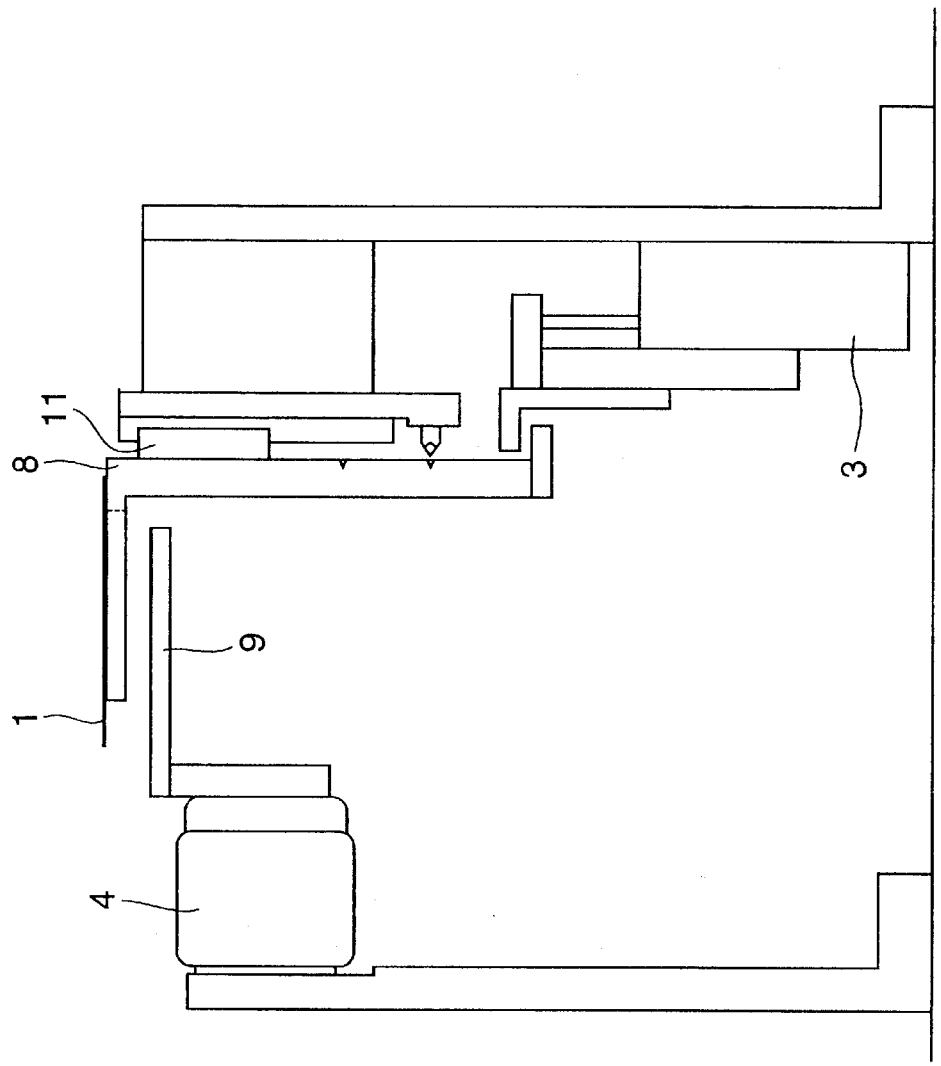

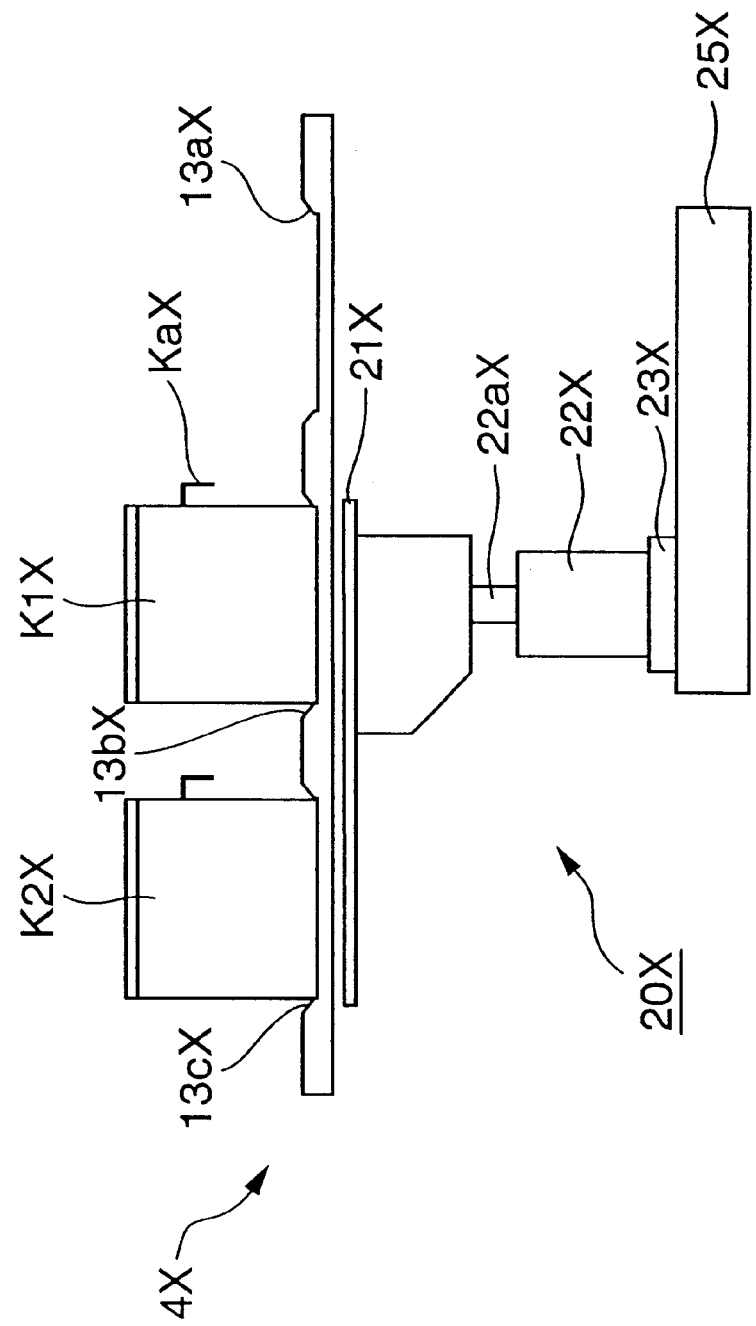

TRANSPORT APPARATUS AND METHOD

FIELD OF THE INVENTION

The present invention relates to a transport apparatus and method which produce less dust, can shorten the tact of work transport, and have versatility requiring no alteration of the apparatus even when the pitch and number of electronic components or the like placed on, e.g., a carrier, change.

BACKGROUND OF THE INVENTION

A conventional carrier transport apparatus used for transporting, e.g., electronic components, placed on a carrier will be described with reference to FIGS. 14 to 20.

FIG. 14 is a schematic perspective view of a conventional cleaning apparatus suitable for using a carrier transport apparatus, FIG. 15 is a partial perspective view of the conventional carrier transport apparatus used in FIG. 14, FIG. 16 is a side view showing the first state for describing the operation of the carrier transport apparatus shown in FIG. 15, FIG. 17 is a side view showing the second state following the state shown in FIG. 16, FIG. 18 is a side view showing the third state following the state shown in FIG. 17, and FIG. 19 is a side view showing the fourth state following the state shown in FIG. 18.

First, the conventional cleaning apparatus will be described with reference to FIG. 14.

Referring to FIG. 14, reference numeral 1X denotes the entire cleaning apparatus. The cleaning apparatus 1X has, on a panel 3X of its main body 2X, a loader portion 4X for loading a carrier KX from, e.g., the left side when seen from the front, a chemical tank 5X, rinsing tanks 6X and 7X, and drying tank 8X sequentially formed on the right side of the loader portion 4X to be adjacent to it, an unloader portion 9X for unloading the carrier KX at the right end of the cleaning apparatus 1X, and a transport robot 11X located behind the loader portion 4X, chemical tank 5X, rinsing tanks 6X and 7X, drying tank 8X, and unloader portion 9X to transport the carrier KX sequentially from the loader portion 4X to the chemical tank 5X, from the chemical tank 5X to the rinsing tank 6X, from the rinsing tank 6X to the next rinsing tank 7X, from the rinsing tank 7X to the next drying tank 8X, and to the unloader portion 9X along a guide 10X. Reference numeral 14X denotes a maintenance door.

The carrier KX storing wafers SX to be surface-treated is loaded on the loader portion 4X. To perform surface treatment of the wafers SX, the transport robot 11X holds and lifts the carrier KX with its hanger 11aX and dips it in the chemical tank 5X. When surface treatment of the wafers SX is ended, the transport robot 11X lifts the carrier KX again with its hanger 11aX, and dips it in the next rinsing tank 6X and then the rinsing tank 7X to clean it. When the wafers SX are cleaned and dried, the transport robot 11X lifts the carrier KX again with its hanger 11aX and places it on the unloader portion 9X at the final stage.

The cleaning apparatus 1X has the above arrangement and performs surface treatment of the wafers SX in this manner. To load the carrier KX storing the unprocessed wafers SX on the loader portion 4X and transport it with the transport robot 11X, first, as shown in the enlarged view of FIG. 15, the operator places the carrier KX on a set station 13aX on the front portion of the loader portion 4X from the front side of the cleaning apparatus 1X. A carrier transport apparatus 20X located in the cleaning apparatus 1X and arranged to oppose an opening 12X of the loader portion 4X transports the carrier KX to a set station 13cX which is close to the transport robot 11X on the rear portion of the loader portion 4X.

At the unloader portion 9X, the carrier KX storing the surface-treated wafers SX is unloaded to a set station 13cX which is close to the transport robot 11X on the rear portion of the unloader portion 9X. Another carrier transport apparatus 20X located in the cleaning apparatus 1X and arranged to oppose an opening 12X of the unloader portion 9X transports the carrier KX to a set station 13aX on the front portion of the unloader portion 9X. In this manner, the operator can unload the carrier KX from the cleaning apparatus 1X easily.

Each of the loader portion 4X and unloader portion 9X is comprised of an elongated opening 12X formed in the panel 3X, and a set station 13X constituted by a pair of opposing steps. The carrier KX is placed on the set station 13X so it is fixed immobile. In this example, as shown in FIG. 15 in enlargement, three set stations 13aX, 13bX, and 13cX are arranged as the set stations 13X.

The conventional carrier transport apparatus 20X will be described with reference to FIG. 15.

The carrier transport apparatuses 20X used at the loader portion 4X and unloader portion 9X have the same arrangement and operation. A description will accordingly be made on the carrier transport apparatus 20X of the loader portion 4X.

The carrier transport apparatus 20X is arranged to oppose the opening 12X formed in the panel 3X of the cleaning apparatus 1X. The carrier transport apparatus 20X has a carrier stage 21X, a vertical drive actuator 22X serving as a driving source with a shaft 22aX for vertically driving the carrier stage 21X in the direction of an arrow Y and for supporting it, a horizontal movable stage 23X for supporting the actuator 22X, and a horizontal drive actuator 25X with a guide rail 24X formed on its surface and serving as a drive source for driving the horizontal movable stage 23X in the horizontal direction of an arrow X along the guide rail 24X.

The carrier stage 21X has a width sufficiently smaller than that of the opening 12X. Hence, when the carrier stage 21X moves up to project from the opening 12X, it does not abut against the edge of the opening 12X.

The operation of the carrier transport apparatus 20X with this arrangement will be described.

Assume that the operator holds the carrier KX with its handle KaX and places it on the set station 13aX. The carrier stage 21X is moved up by the vertical drive actuator 22X in the direction of the arrow Y to lift the carrier KX. When a lower end KbX of the carrier KX completely comes out of the set station 13aX and is positioned above the surface of the panel 3X, the vertical drive actuator 22X stops and holds the carrier KX at its height.

Subsequently, the horizontal movable stage 23X is moved by the horizontal drive actuator 25X in the direction of the arrow X along the guide rail 24X. When the carrier KX reaches a position above the set station 13bX, the horizontal drive actuator 25X stops.

The carrier stage 21X is moved down by the vertical drive actuator 22X in the direction of the arrow Y, and the lower end KbX of the carrier KX is positioned by the set station 13bX. When the carrier stage 21X further moves down to completely separate from the lower end KbX of the carrier KX, the vertical drive actuator 22X stops. The carrier stage 21X is then moved by the horizontal drive actuator 25X in the direction of the arrow X to return to the initial stop position. In this manner, the carrier KX can be transported from the set station 13aX to the set station 13bX.

The carrier stage 21X can place two carriers KX on it, and can transport the carrier KX from the set station 13bX to the set station 13cX. The carrier stage 21X also can transport the two carriers KX simultaneously. A case wherein the two carriers KX are to be transported simultaneously will be described with reference to FIGS. 16 to 19.

Assume that carriers K1X and K2X are respectively placed on the set stations 13aX and 13bX, as shown in FIG. 16. The vertical drive actuator 22X is actuated, so the carrier stage 21X moves up the two carriers K1X and K2X, as shown in FIG. 17. At the upper position, the horizontal drive actuator 25X is actuated next to move the carrier stage 21X horizontally, as shown in FIG. 18, so the carriers K1X and K2X are moved to positions above the set stations 13bX and 13cX, respectively. In this state, the vertical drive actuator 22X is actuated and moved down, as shown in FIG. 19, to place the carriers K1X and K2X on the set stations 13bX and 13cX, respectively. Transport operation is thus completed.

As such a carrier transport apparatus, a transport apparatus as described in, e.g., Japanese Patent Laid-Open No. 06-140493 is proposed.

The carrier is transported as described in Japanese Patent Laid-Open No. 06-140493. With the conventional transport apparatus, when the pitch and number of works to be placed on the carrier change, the transport apparatus must be altered. Therefore, in the conventional transport apparatus, when the pitch and number of works to be placed on the carrier change, much labor and cost are needed to cope with it.

SUMMARY OF THE INVENTION

The present invention has been made in view of the problem described above, and has as its object to provide a transport apparatus and method which can cope with a change in pitch and number of works (workpieces) to be placed on a carrier without altering the transport apparatus.

In order to solve the problem described above and to achieve the above object, a transport apparatus according to the present invention is characterized in the following arrangement.

More specifically, there is provided a transport apparatus for transporting a carrier with a plurality of works placed thereon, comprising loading means for loading the carrier into a processing unit for performing a predetermined process for the works, transport means for receiving the carrier loaded by the loading means and intermittently transporting the carrier such that the plurality of works are sequentially positioned at a process position of the processing unit one by one, and unloading means for receiving the carrier from the transport means after all of the plurality of works are subjected to the predetermined process at the process position, and unloading the carrier outside the processing unit.

A transport method according to the present invention is characterized in the following arrangement.

More specifically, there is provided a transport method of transporting a carrier with a plurality of works placed thereon, characterized by comprising the steps of loading the carrier into a processing unit for performing a predetermined process for the works, intermittently transporting the carrier, loaded in the loading step, such that the plurality of works are sequentially positioned at a process position of the processing unit one by one, and unloading the carrier outside the processing unit after all of the plurality of works are subjected to the predetermined process at the process position.

Other objects and advantages besides those discussed above shall be apparent to those skilled in the art from the description of a preferred embodiment of the invention which follows. In the description, reference is made to accompanying drawings, which form a part hereof, and which illustrate an example of the invention. Such example, however, is not exhaustive of the various embodiments of the invention, and therefore reference is made to the claims which follow the description for determining the scope of the invention.

BRIEF DESCRIPTION OF THE DRAWINGS

FIG. 12 is a plan view showing that the next carrier can wait in the transport apparatus of the embodiment regardless of the tact time of a unit before or after the transport apparatus of the embodiment;

FIG. 13A is a plan view showing the transport apparatus of the embodiment entirely;

FIG. 13B is a side view showing the transport apparatus of the embodiment entirely;

FIG. 19 is a side view showing the fourth state following the state shown in FIG. 18.

DETAILED DESCRIPTION OF THE PREFERRED EMBODIMENT

One preferred embodiment of the present invention will be described in detail with reference to the accompanying drawings.

FIG. 13A is a plan view showing the overall arrangement of a transport apparatus according to one embodiment of the present invention, and FIG. 13B is a side view of the same.

Figure 8:
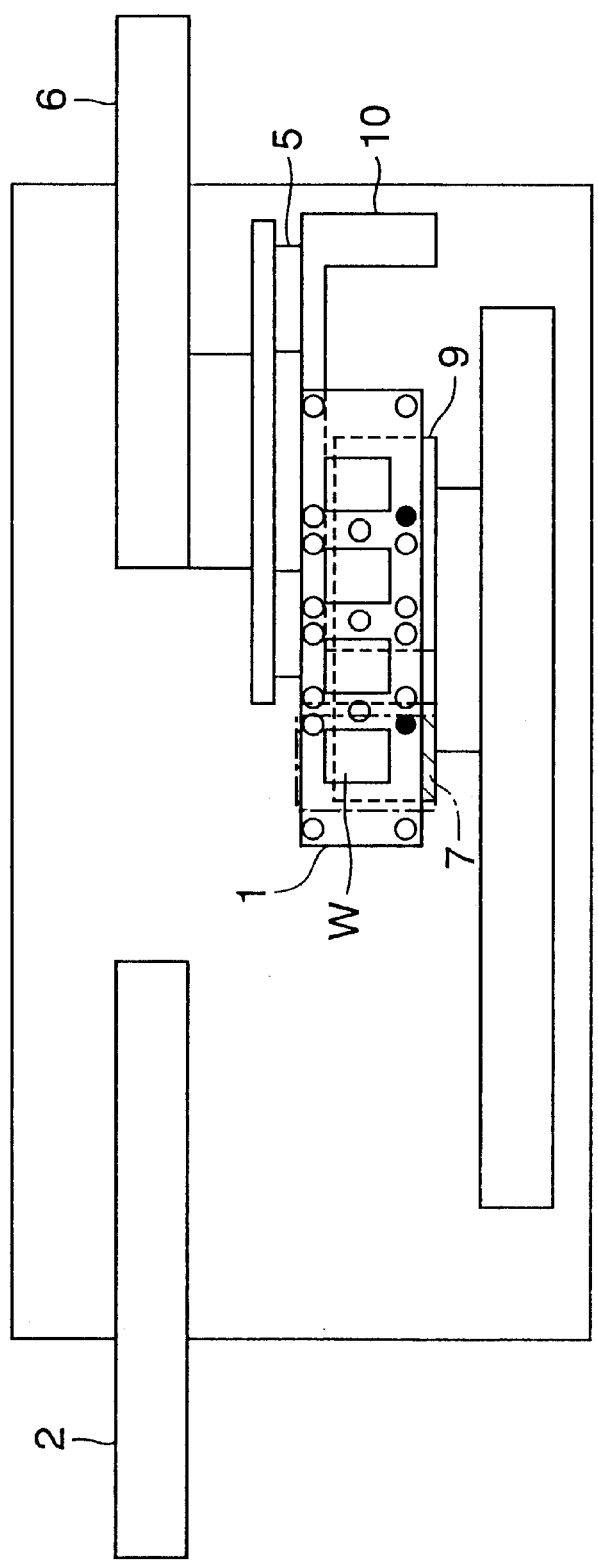
FIG. 8 is the eighth plan view showing a series of operations of the transport apparatus of the embodiment.
Figure 9:
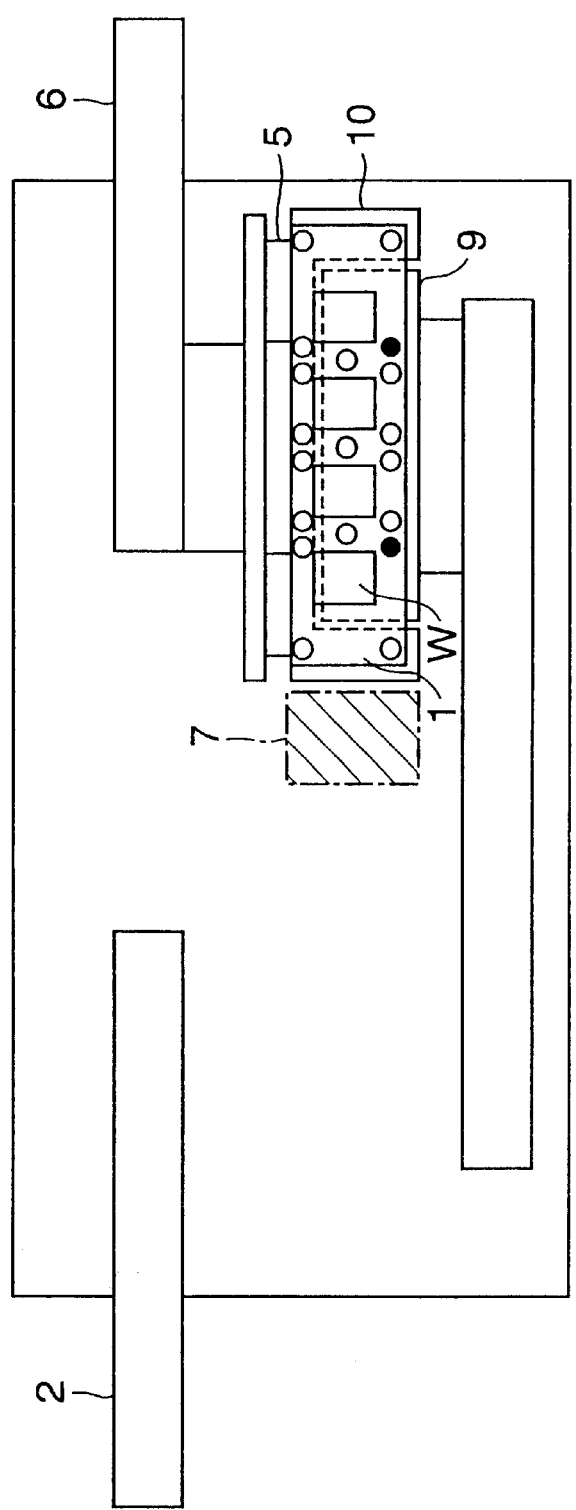
FIG. 9 is the ninth plan view showing a series of operations of the transport apparatus of the embodiment.
Figure 10:
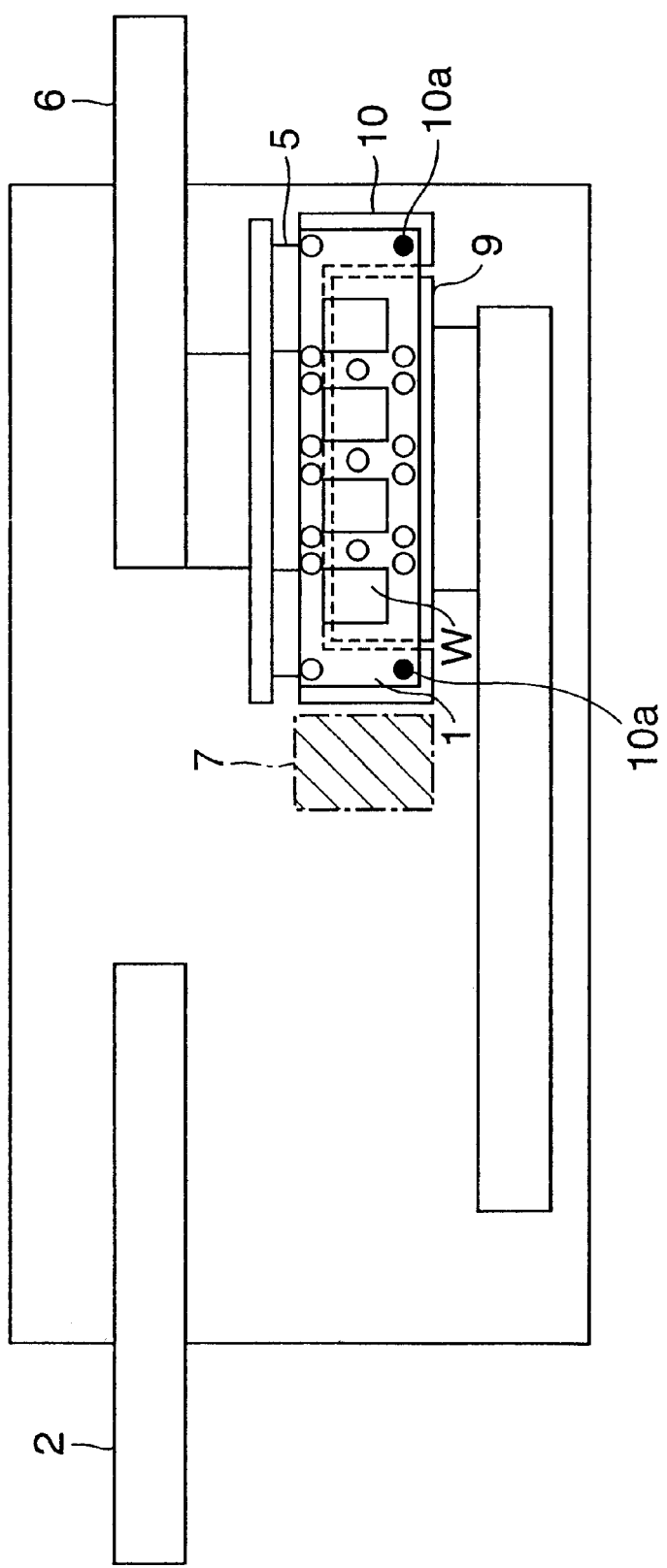
FIG. 10 is the 10th plan view showing a series of operations of the transport apparatus of the embodiment.

FIGS. 1 to 11 are plan views showing a transport method for the transport apparatus of this embodiment, and FIG. 10 shows the entire apparatus that performs operation.

Figure 1:
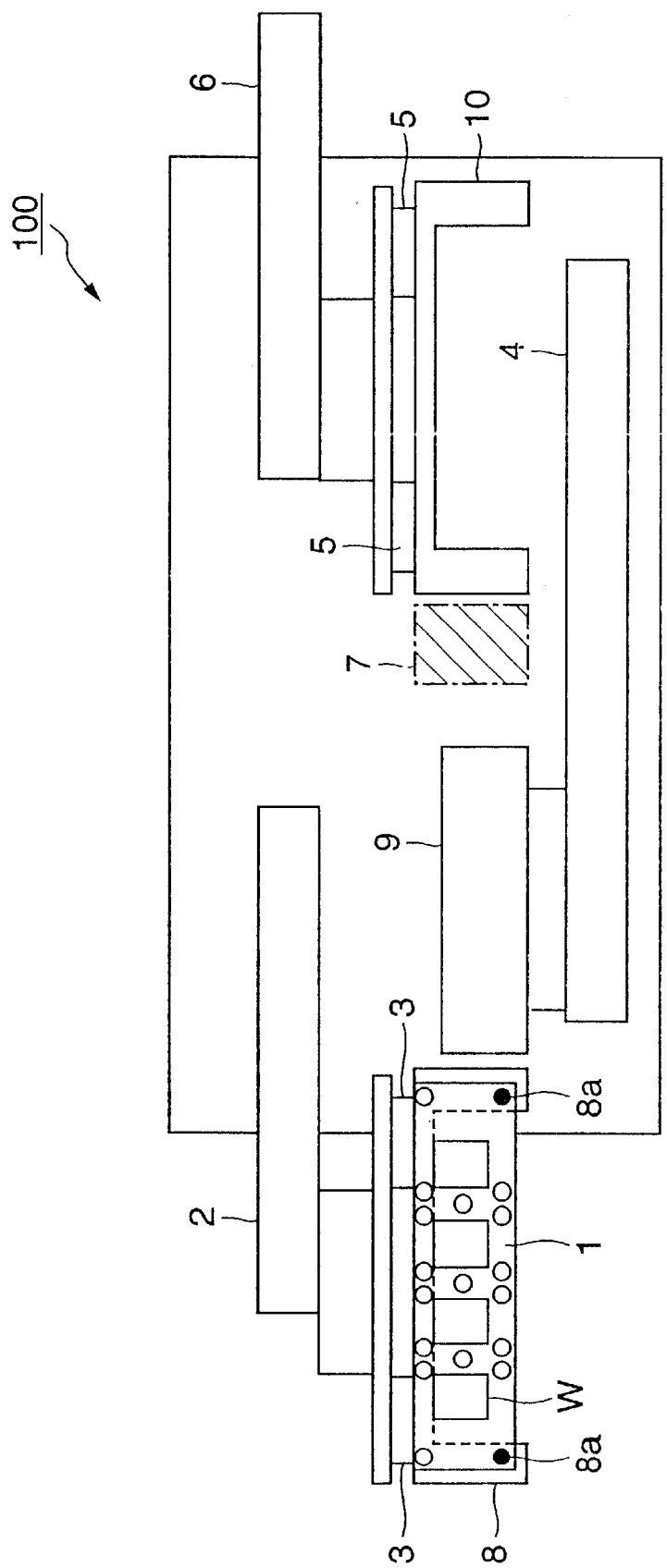
FIG. 1 is the first plan view showing a series of operations of a transport apparatus according to one embodiment.

FIG. 1 shows how a carrier is loaded from a preceding apparatus to the apparatus of this embodiment. A carrier 1 is transported from the left to the right of FIG. 1. At this time, the carrier 1 is placed on a table 8 attached to a cylinder 2. In this embodiment, four works W are placed on the carrier 1, but if the carrier tape has a constant length, an arbitrary number of works W can be placed at arbitrary pitches within this length. Reference numeral 2 denotes a cylinder for transferring the carrier 1 from the preceding apparatus. Positioning pins 8a are attached to the table 8, and are inserted in holes formed in the carrier 1, thereby positioning the carrier 1.

Figure 2:
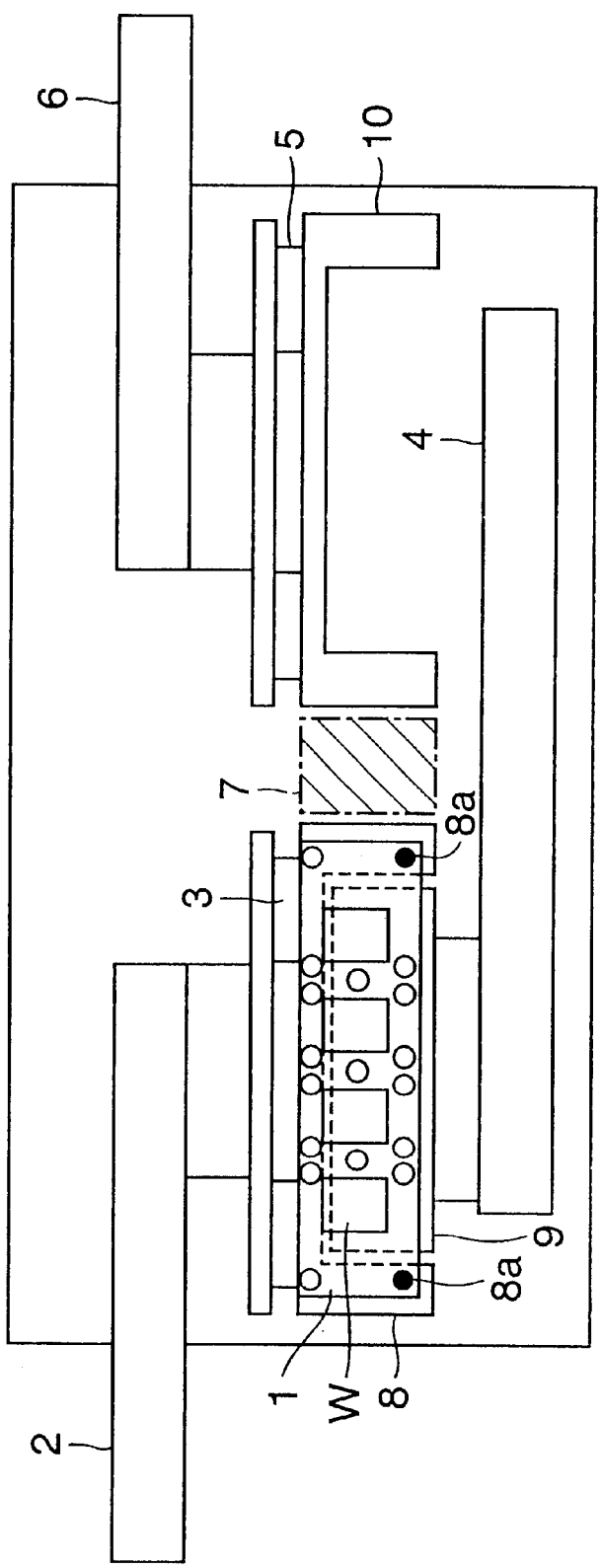
FIG. 2 is the second plan view showing a series of operations of the transport apparatus of the embodiment.

FIG. 2 shows a state wherein the carrier is loaded to the apparatus of this embodiment. At this time, since the table 8 is transferred at a height larger than that of a table 9, the tables 8 and 9 do not interfere with each other. The table 9 is mounted on a robot 4.

Figure 3:
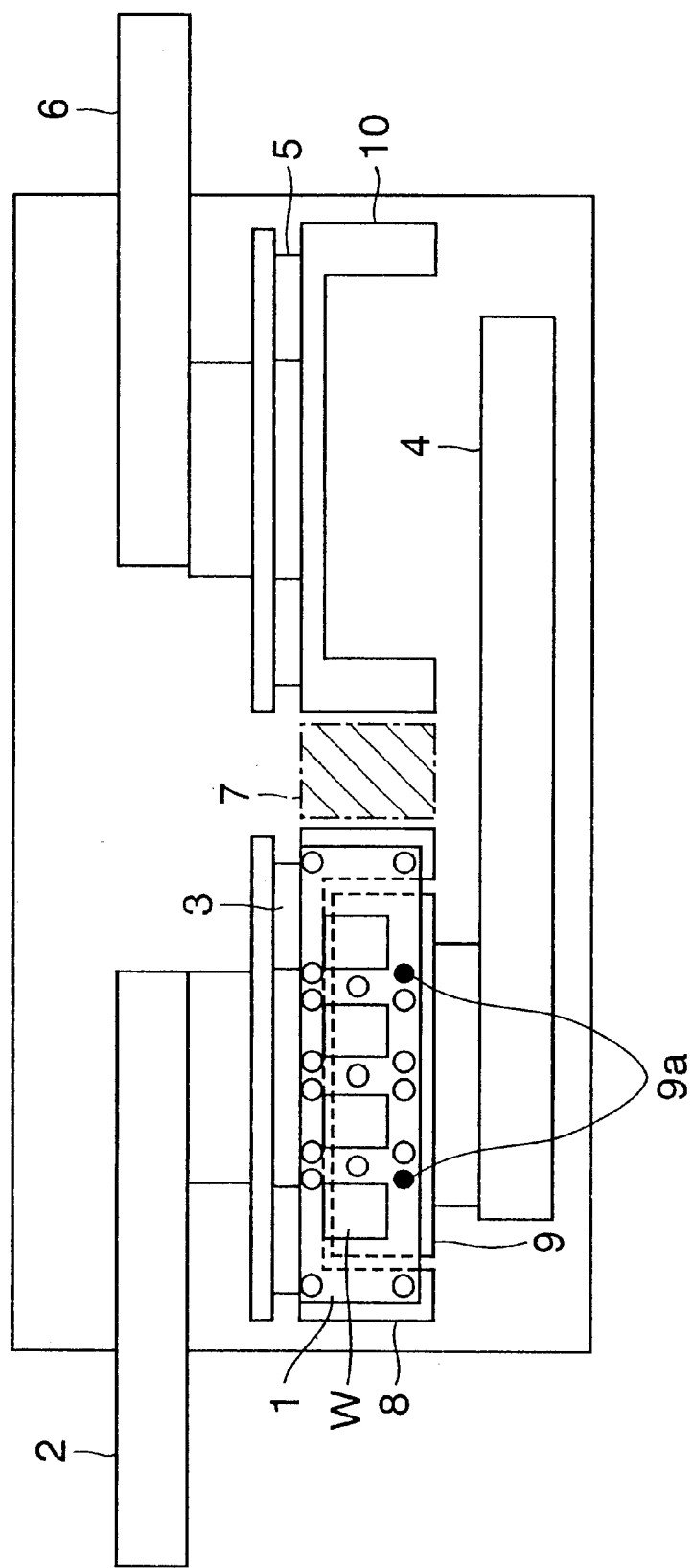
FIG. 3 is the third plan view showing a series of operations of the transport apparatus of the embodiment.

In FIG. 3, cylinders 3 move down, so the carrier 1 is transferred down from the table 8 to the table 9 without friction, thus without producing dust. Since the table 8 forms a U shape and the table 9 forms a rectangular shape, they do not interfere with each other when moving vertically. Positioning pins 9a are attached to the table 9 as well and inserted in holes formed in the carrier 1, thereby positioning the carrier 1.

Figure 4:
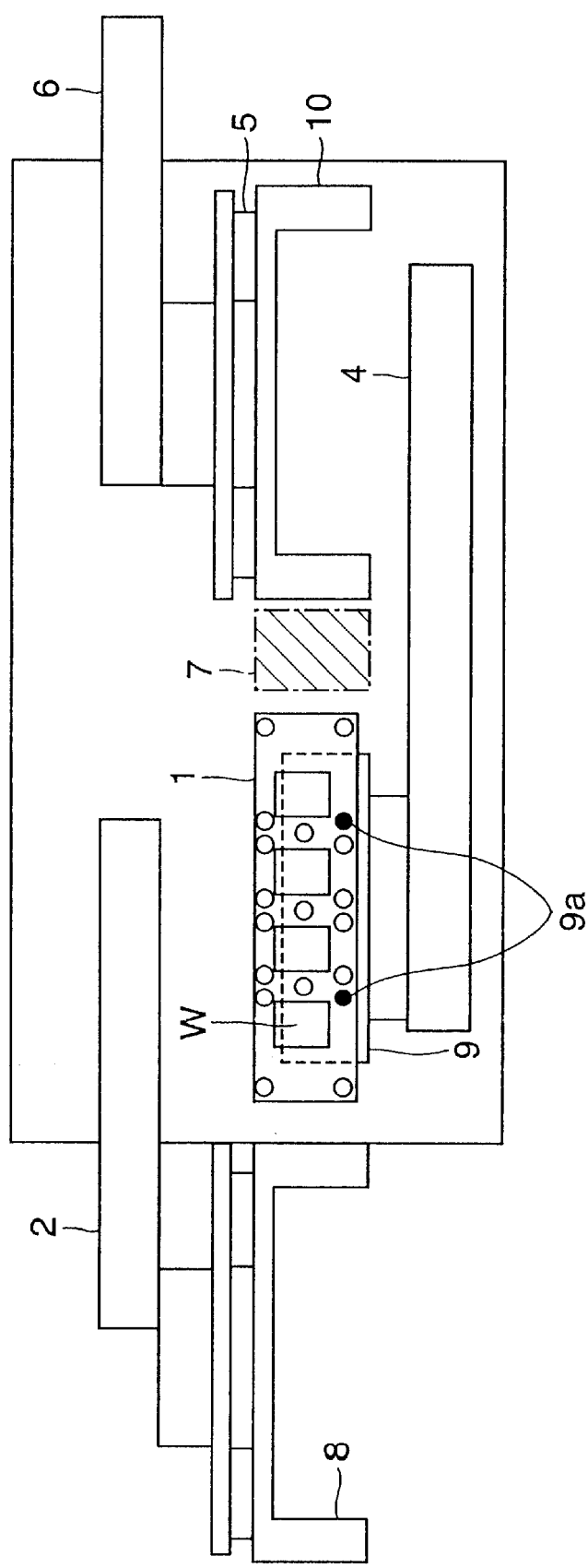
FIG. 4 is the fourth plan view showing a series of operations of the transport apparatus of the embodiment.

In FIG. 4, after the carrier 1 is transferred from the table 8 to the table 9, the table 8 moves down to be lower than the table 9. After the table 8 moves down to a position where it does not interfere with the table 9, it is returned to the preceding apparatus by the cylinder 2, and prepares for next carrier transfer.

Figure 5:
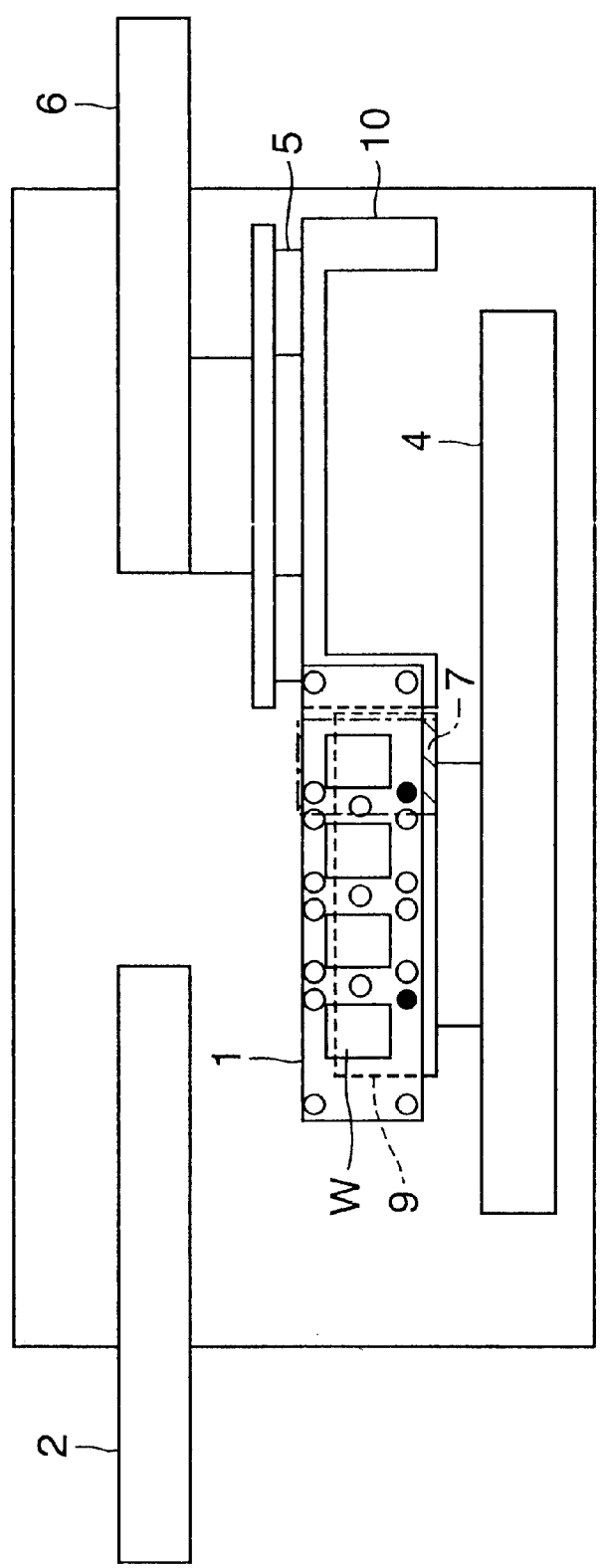
FIG. 5 is the fifth plan view showing a series of operations of the transport apparatus of the embodiment.
Figure 6:
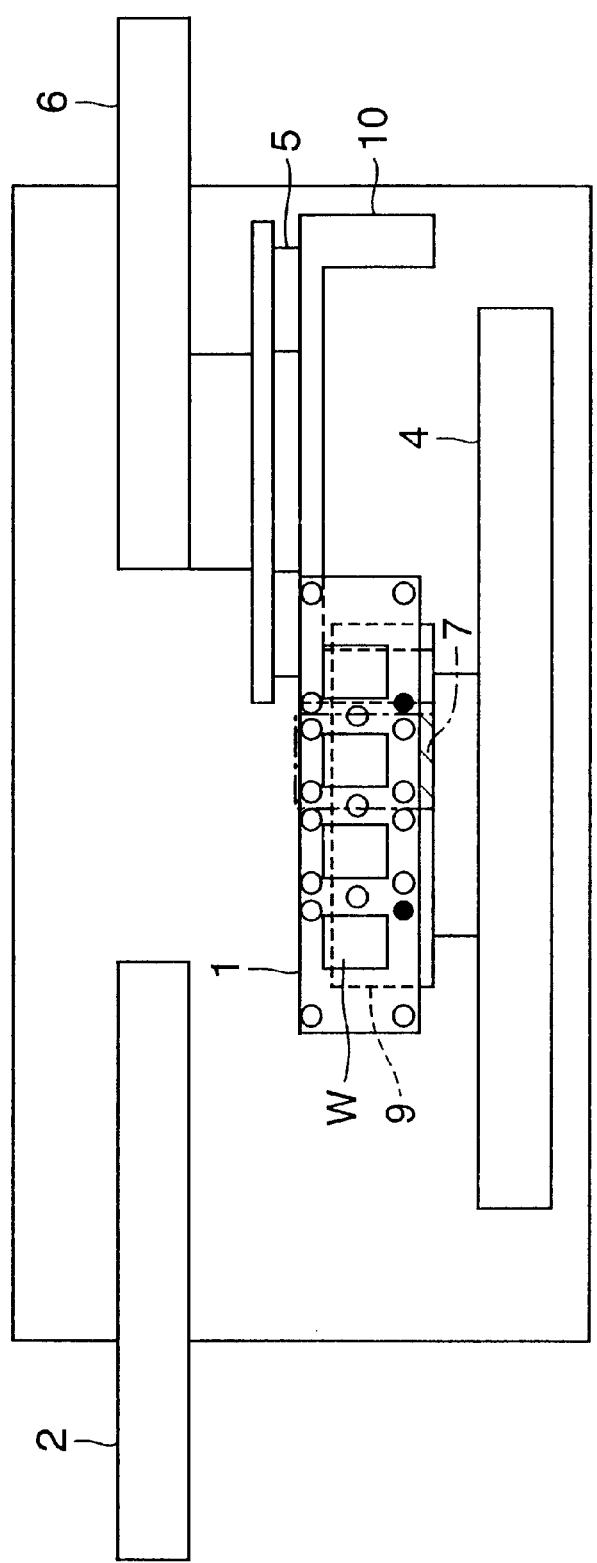
FIG. 6 is the sixth plan view showing a series of operations of the transport apparatus of the embodiment.

FIG. 5 shows a state wherein the carrier 1 is transported by the robot 4. The carrier 1 is transported together with the table 9 by the robot 4, and moves for a distance designated in advance in accordance with the pitch and number of works placed on it, so the first work W is transported to an actual operation area 7. The carrier 1 is stopped for, e.g., 10 sec for operation, transports the second work to the operation area 7, and is stopped for 10 sec. FIG. 6 shows this state. The robot 4 can move for an arbitrary distance in accordance with the pitch of the works placed on the carrier 1.

Figure 7:
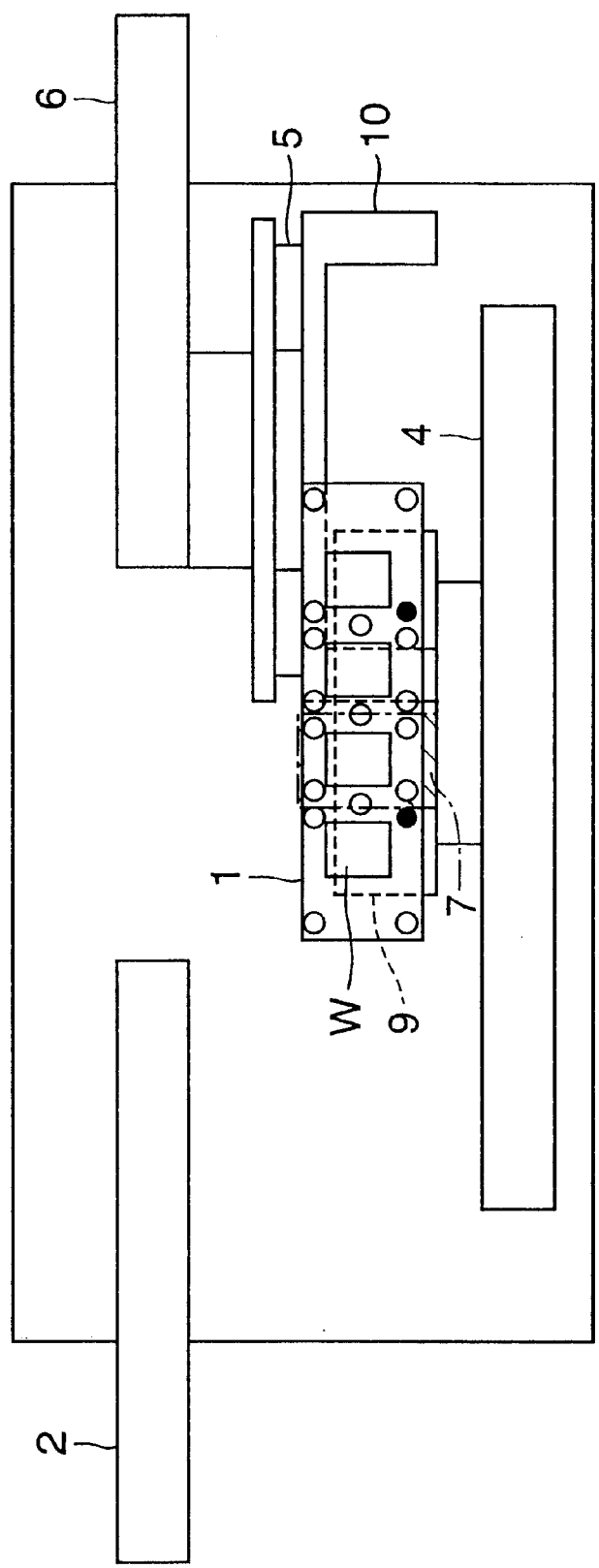
FIG. 7 is the seventh plan view showing a series of operations of the transport apparatus of the embodiment.

FIG. 7 shows a state wherein the third work has been transported to the operation area 7.

FIG. 8 shows a state wherein the fourth work has been transported to the operation area 7.

FIG. 9 shows a state wherein operation for the fourth work is ended and the carrier 1 has moved to the cylinder 6 that transports it to the succeeding apparatus. At this time, a table 10 mounted on the cylinder 6 is waiting at a position lower than that of the table 9. This height corresponds to the height with which the table 8 mounted on the cylinder 2 moves from this apparatus 100 to the preceding apparatus. In other words, the table 8 mounted on the cylinder 2 waits in the state shown in FIG. 9.

In FIG. 10, the cylinders 5 lift the table 10 from under the table 9 to transfer the carrier 1 from the table 9 to the table 10. Positioning pins 10a are also attached to the table 10, and are inserted in holes formed in the carrier 1, thereby positioning the carrier 1.

Figure 11:
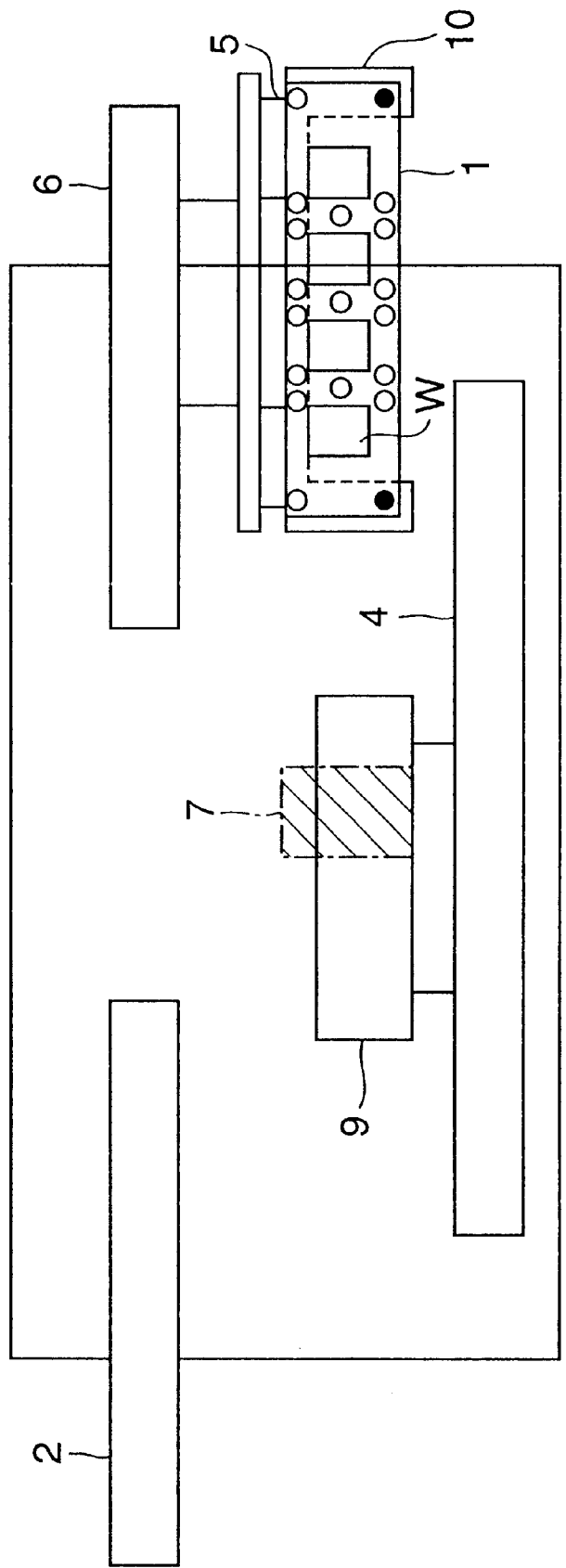
FIG. 11 is the 11th plan view showing a series of operations of the transport apparatus of the embodiment.
Figure 14:
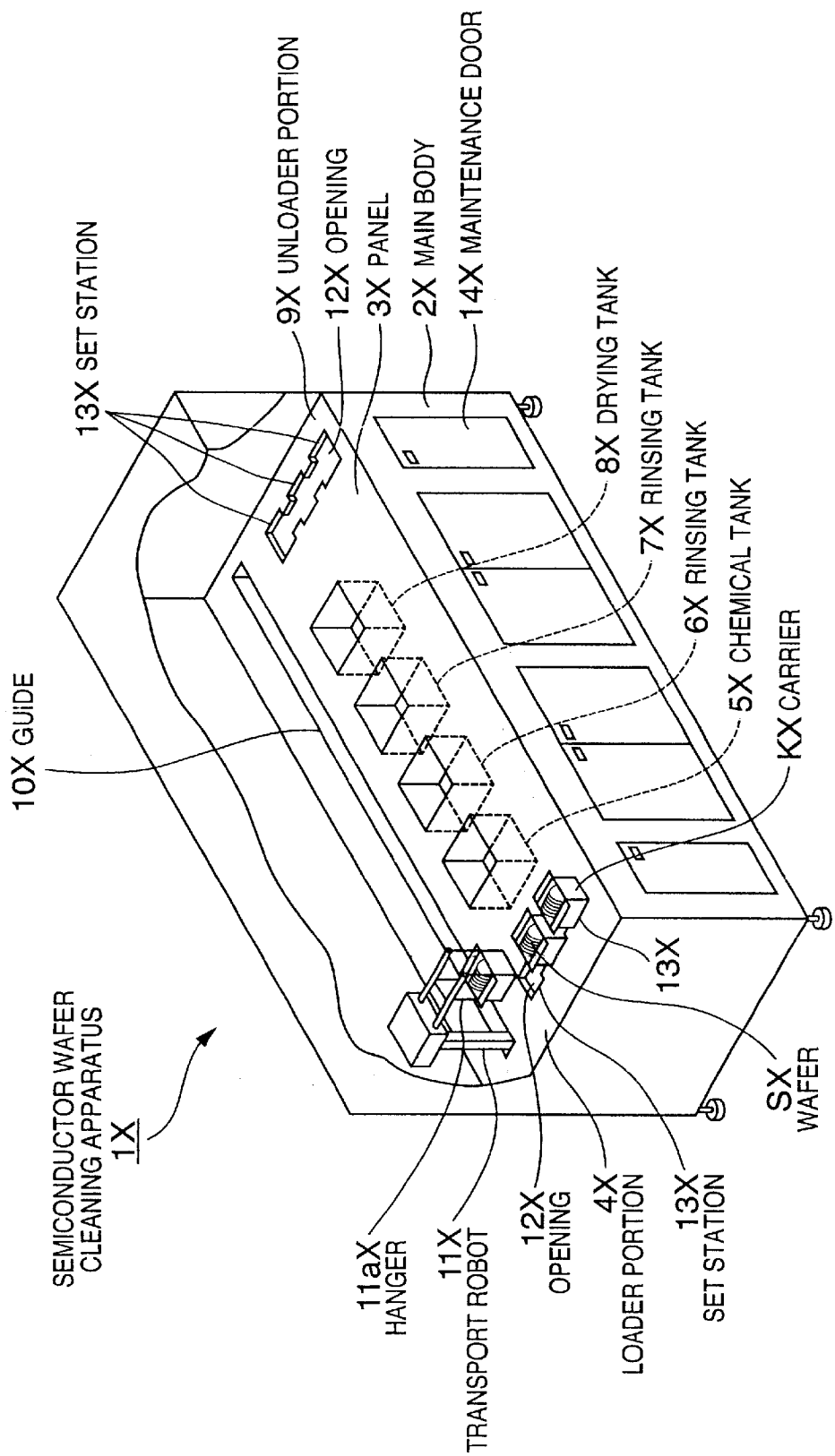
FIG. 14 is a schematic perspective view of a conventional cleaning apparatus using a conventional carrier transport apparatus.
Figure 15:
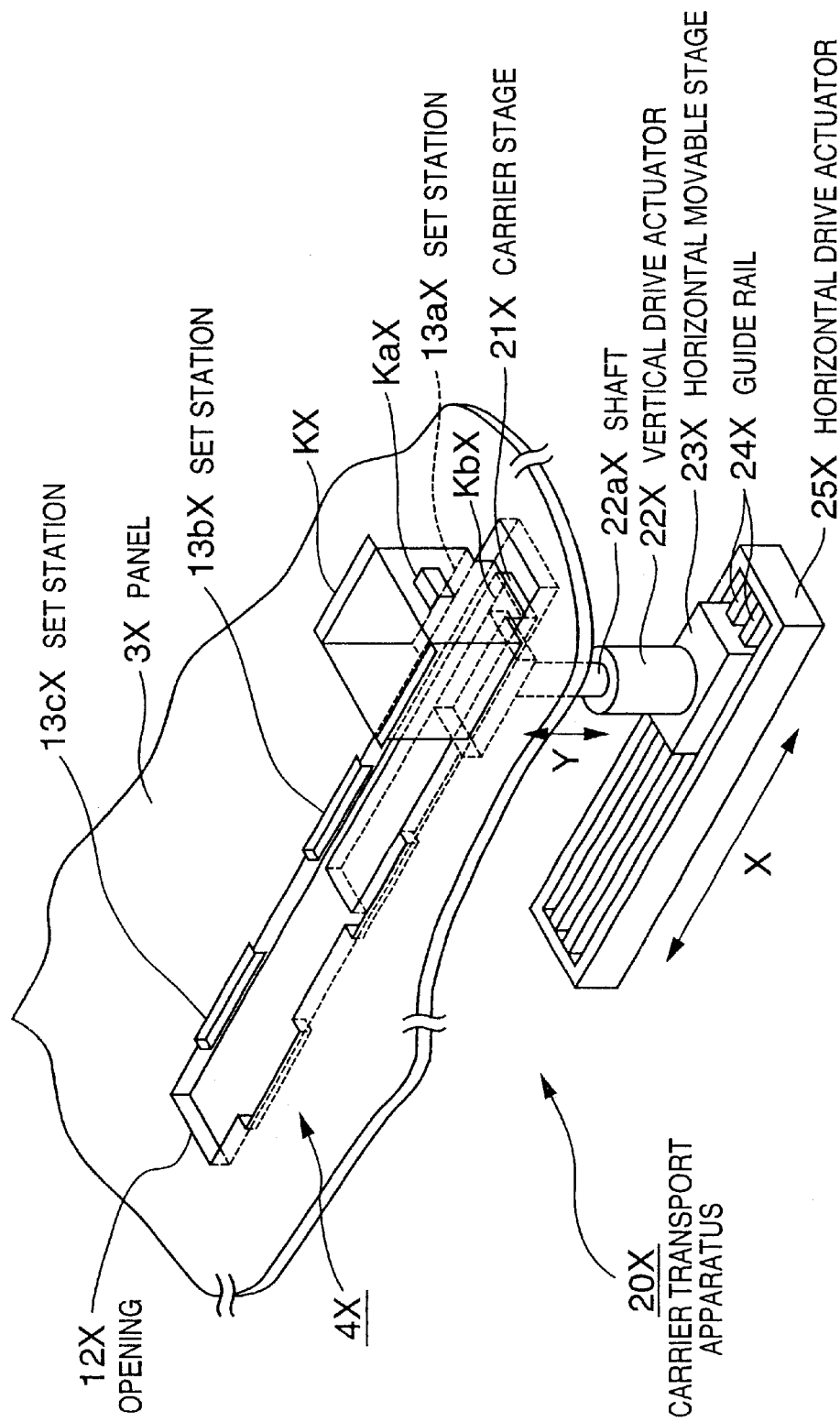
FIG. 15 is a partial perspective view of the conventional carrier transport apparatus used in FIG. 14.
Figure 16:
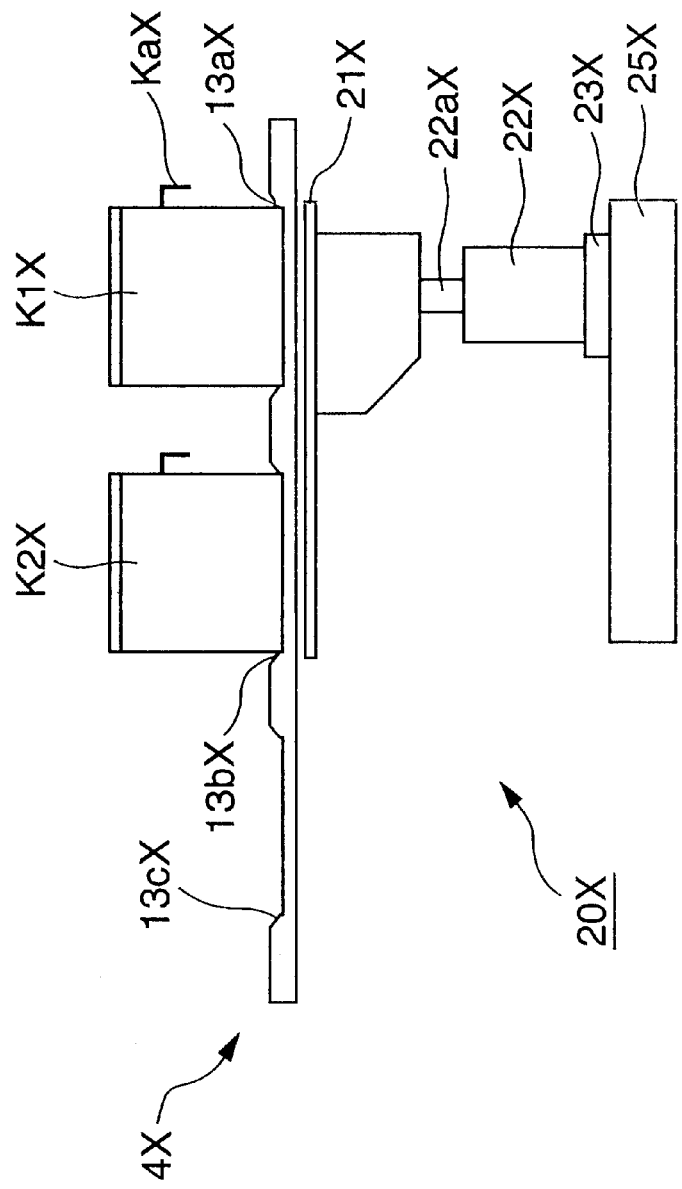
FIG. 16 is a side view showing the first state for describing the operation of the carrier transport apparatus shown in FIG. 15.
Figure 17:
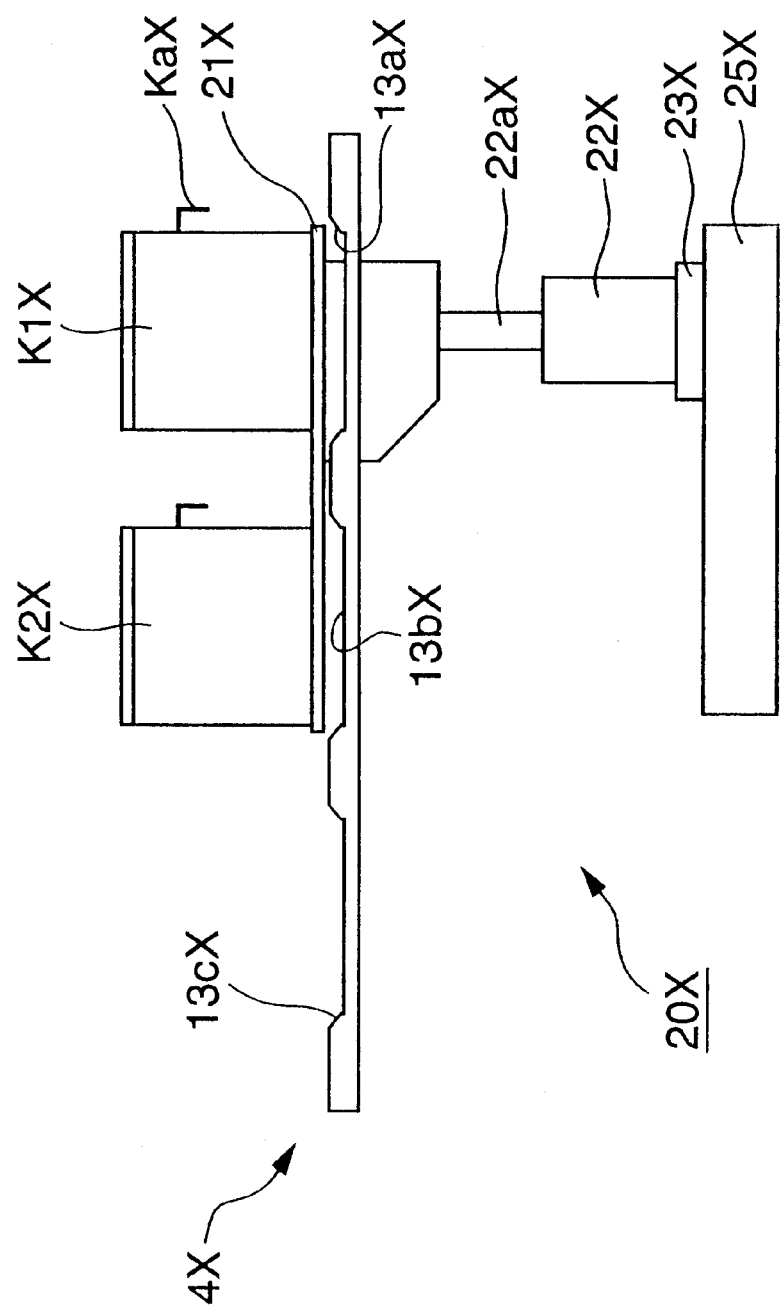
FIG. 17 is a side view showing the second state following the state shown in FIG. 16.
Figure 18:
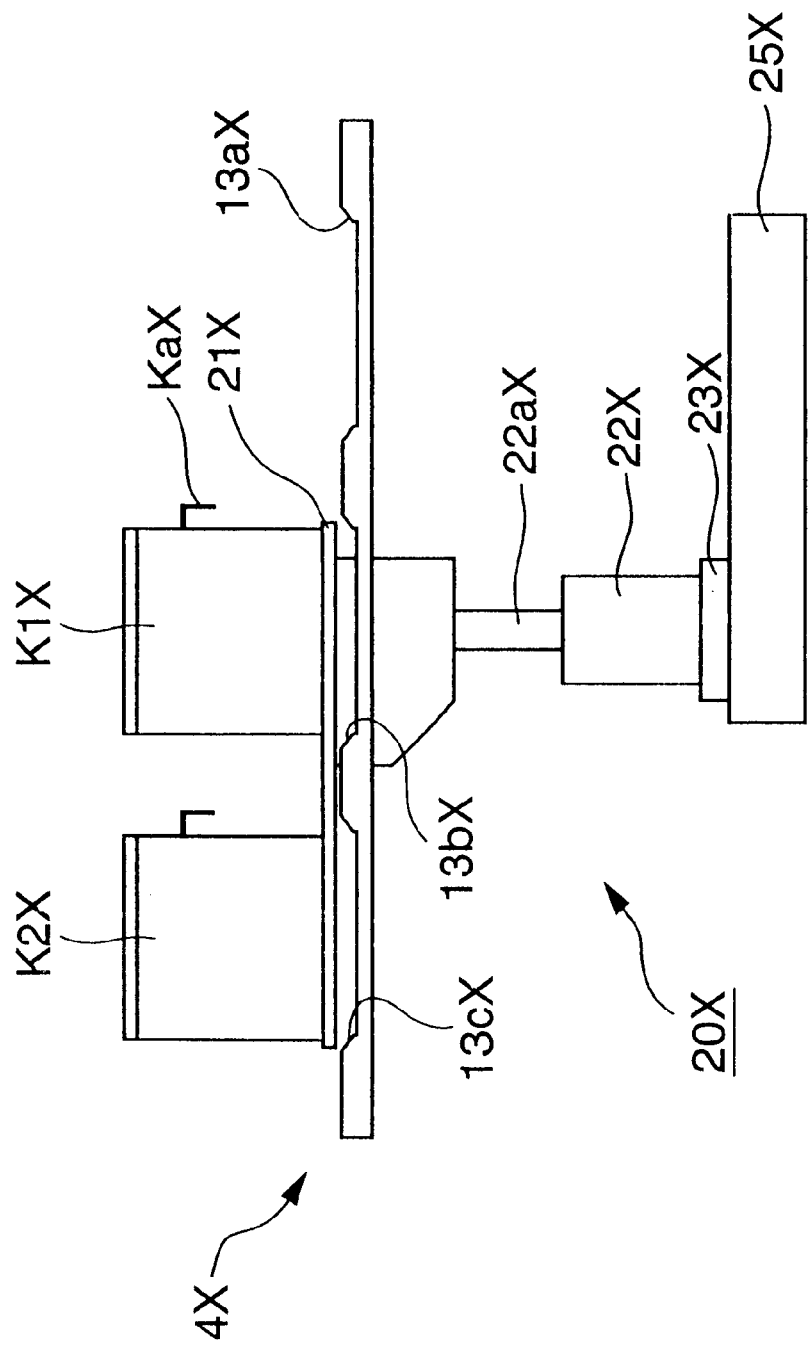
FIG. 18 is a side view showing the third state following the state shown in FIG. 17.

In FIG. 11, the carrier 1 placed on the table 10 is transported from this apparatus to the succeeding apparatus.

As shown in FIG. 4, once the carrier 1 is placed on the table 9, even if a next carrier is carried from the preceding apparatus, since the tables 8 and 9 are shifted in the direction of height, the next carrier can wait in the apparatus 100 of this embodiment regardless of the time tact of the preceding or succeeding apparatus. FIG. 12 shows this state.

As has been described above, according to this embodiment, even when the pitch and number of works to be placed on the carrier change, it can be coped with without altering the transport apparatus. Since the next carrier waits in the apparatus, the tact time of transport is suppressed, and dust is prevented from being produced.

As has been described above, according to this embodiment, even when the pitch and number of works to be placed on the carrier change, it can be coped with without altering the transport apparatus.

The present invention is not limited to the above embodiments and various changes and modifications can be made within the spirit and scope of the present invention. Therefore, to apprise the public of the scope of the present invention the following claims are made.

What is claimed is:

1. A transport apparatus for transporting a carrier with a plurality of works placed thereon, comprising:

loading means for loading the carrier into a processing unit for performing a predetermined process for the works;

transport means for receiving the carrier loaded by said loading means and intermittently transporting the carrier such that the plurality of works are sequentially positioned at a process position of the processing unit one by one; and unloading means for receiving the carrier from said transport means after all of the plurality of works are subjected to the predetermined process at the process position, and unloading the carrier outside the processing unit, wherein the work is processed in the state it is placed on the carrier.

2. The apparatus according to claim 1, wherein the carrier can accommodate an arbitrary number of works thereon within a range of a size thereof.

3. The apparatus according to claim 1, wherein said loading means has a carrier stage portion including a positioning pin for positioning the carrier, and the carrier has a positioning hole for fitting said positioning pin.

4. The apparatus according to claim 1, wherein said transport means has a carrier stage portion including a positioning pin for positioning the carrier, and the carrier has a positioning hole for fitting said positioning pin.

5. The apparatus according to claim 1, wherein said unloading means has a carrier stage portion including a positioning pin for positioning the carrier, and the carrier has a positioning hole for fitting said positioning pin.

6. The apparatus according to claim 1, wherein the carrier contains the plurality of works thereon at an arbitrary pitch width.

7. The apparatus according to claim 6, wherein said transport means intermittently transports the carrier a distance matching the pitch width of the plurality of works.

8. A transport apparatus for transporting a carrier with a plurality of works placed thereon, comprising:

loading means for loading the carrier into a processing unit for performing a predetermined process for the works, said loading means capable of vertical movement and having a first carrier stage portion;

transport means for receiving the carrier loaded by said loading means and intermittently transporting the carrier such that the plurality of works are sequentially positioned at a process position of the processing unit one by one, said transport means having a second carrier stage portion; and unloading means for receiving the carrier from said transport means after all of the plurality of works are subjected to the predetermined process at the process position, and unloading the carrier outside the processing unit, said unloading means capable of vertical movement and having a third carrier stage portion, wherein said first carrier stage portion and said second carrier stage portion are shaped so as not to interfere with each other when vertically moved to overlap each other in a planar direction.

9. A transport apparatus for transporting a carrier with a plurality of works placed thereon, comprising:

loading means for loading the carrier into a processing unit for performing a predetermined process for the works, said loading means capable of vertical movement and having a first carrier stage portion;

transport means for receiving the carrier loaded by said loading means and intermittently transporting the carrier such that the plurality of works are sequentially positioned at a process position of the processing unit one by one, said transport means having a second carrier stage portion; and unloading means for receiving the carrier from said transport means after all of the plurality of works are subjected to the predetermined process at the process position, and unloading the carrier outside the processing unit, said unloading means capable of vertical movement and having a third carrier stage portion, wherein said third carriage stage portion and said second carrier stage portion are shaped so as not to interfere with each other when vertically moved to overlap each other in a planar direction.

10. A transport method of transporting a carrier with a plurality of works placed thereon, comprising the steps of:

loading the carrier into a processing unit for performing a predetermined process for the works;

intermittently transporting the carrier, loaded in the loading step, such that the plurality of works are sequentially positioned at a process position of the processing unit one by one;

processing the work in the state that it is placed on the carrier; and unloading the carrier outside the processing unit after all of the plurality of works are subjected to the predetermined process at the process position.

* * * * *